United States Patent [19]
Miller et al.

[11] Patent Number: 5,506,910
[45] Date of Patent: Apr. 9, 1996

[54] AUTOMATIC EQUALIZER

[75] Inventors: Gary L. Miller; Glenn S. Zelniker, both of Gainesville, Fla.

[73] Assignee: Sabine Musical Manufacturing Company, Inc., Gainesville, Fla.

[21] Appl. No.: 181,093

[22] Filed: Jan. 13, 1994

[51] Int. Cl.[6] ................................................. H03G 5/00
[52] U.S. Cl. ................................................ 381/103; 381/107
[58] Field of Search ............................... 382/203, 96, 98, 382/107–108

[56]  References Cited

U.S. PATENT DOCUMENTS

| | | | |
|---|---|---|---|
| 4,340,780 | 7/1982 | Odlen | 381/103 |
| 4,610,024 | 9/1986 | Schulhof | 381/103 |
| 4,612,665 | 9/1986 | Inami et al. | 381/103 |
| 4,628,530 | 12/1986 | Op De Beek et al. | 381/103 |
| 4,631,749 | 12/1986 | Rapaich | 381/103 |
| 4,739,513 | 4/1988 | Kunugi et al. | 381/103 |
| 4,888,808 | 12/1989 | Ishikawa et al. | 381/103 |
| 5,146,507 | 9/1992 | Satoh et al. | 381/103 |
| 5,384,856 | 1/1995 | Kyouno et al. | 381/103 |
| 5,386,478 | 1/1995 | Plunkett | 381/103 |

*Primary Examiner*—Stephen Brinich
*Attorney, Agent, or Firm*—Donald W. Marks

[57]  ABSTRACT

An automatic equalizer sequentially adds subdued narrow band audio reference signals of different frequencies to an audio program signal being broadcast, and measures the magnitude of each successive broadcast reference signal to determine a measured frequency response of an audio amplification system and its environment. The gains, or attenuations, of various frequency bands in the broadcast signal are adjusted as needed to produce a desired frequency response. In one embodiment the added reference signals are masked by adding the reference signals only when the test frequency is adjacent to a relatively large magnitude frequency component of the program signal. Additional masking is performed by the reference signal being relative quiet and of a short duration such as two to twenty cycles. A narrow band notch filter operates in synchronism with the reference signal adder to eliminate any program signal component at the frequency of each reference signal being added.

10 Claims, 8 Drawing Sheets

AUTOMATIC EQUALIZER

TECHNICAL FIELD

The present invention relates to equalizers in audio amplification systems for automatically adjusting the relative amplitude of frequency bands in a broadcast audio spectrum to produce a desired frequency response and/or to compensate for variation in frequency response of rooms, concert halls, speaker systems, etc.

BACKGROUND ART

In the amplification and broadcast of music or other performances, either live or from recordings, the tonal content of the broadcast audio program can be distorted by frequency dependent attenuation or reinforcement from characteristics of the room, concert hall, speaker system, or other factors affecting the sound. An equalizer is often used in the amplification system to correct or produce a desired frequency response of the broadcast system and environment producing the audio program heard by the audience. In an ideal mathematical sense, the broadcast system and environment can be considered as a transfer function, H(s), and the desired frequency response can be considered as a function, $H_d(s)$. If the system is first brought to unity, i.e., $1=H(s) \times H^{-1}(s)$, and followed by $H_d(s)$, the overall series of transfer functions is: $H(s) \times H^{-1}(s) \times H_d(s)$, which is equal to the desired transfer function $H_d(s)$. The series functions $H^{-1}(s) \times H_d(s)$ are equal to a correction function $H_c(s)$ which when applied to the transfer function H(s) yields the desired transfer function, i.e., $H_d(s)=H(s) \times H_c(s)$.

In many audio amplification systems, the correction function, $H_c(s)$, is approximated by dividing the audio spectrum into a plurality of frequency bands and then selectively adjusting the attenuation, or amplification, of each of the corresponding frequency bands to produce the desired frequency response. In a system with a manual equalizer, a reference sound consisting of "white noise" which has a constant amplitude vs. frequency characteristic across the audio spectrum, or "pink noise" which has a frequency spectrum content equal on a logarithmic basis across the audio spectrum, is applied to the input of the system, and the broadcast noise is picked up by a microphone connected to an audio spectrum analyzer. The operator then adjusts the gain of the frequency bands, such as by slide attenuators of the equalizer, until a desired or flat frequency response appears on the audio spectrum analyzer. The prior art also discloses automatic systems using pink or white noise with frequency analyzing units providing control signals to automatically set equalizers. Manual or automatic set up of an equalizer using pink or white noise during a performance is not desirable because the noise, which roars like Niagara Falls, would be objectionable to most audiences. Thus, the equalizer systems using pink or white noise cannot compensate for changes in the acoustics of the performance area such as caused by the presence of an audience, movement of microphones, etc., during the performance.

The prior art also contains automatic equalizers which simultaneously monitor the input signal and the audio output of an audio amplification system. The audio output broadcast by speakers is monitored by a microphone placed in the listening environment to produce a reference signal. The magnitudes of frequency bands in the input signal are compared to the corresponding magnitudes of frequency bands in the reference signal. The outputs of the comparators are used to automatically adjust an equalizer. The equalizer can be in the form of a digital filter such as a finite impulse response (FIR) or an infinite impulse response (IIR) digital filter practiced by a corresponding algorithm in a microprocessor such as a digital signal processor (DSP). Inherent delays between the input signal and the reference signal pickup as well as rapid variation in frequency content and magnitude of the incoming program signal, result in errors in determining the present frequency response of the broadcast system causing distortion in the equalized program.

SUMMARY OF INVENTION

The invention is summarized in an automatic equalizer for an audio program amplification system wherein a plurality of narrow band reference signals of different frequencies are sequentially or randomly added to an electrical program signal for amplification by a power amplifier and broadcasting from a speaker. The magnitudes of the narrow band reference signals in the broadcast audio program are detected and measured. Automatic equalization of the electrical program signal is performed based upon the detected magnitudes of broadcast reference signals in the audio program to produce a desired frequency response in the amplification system.

An object of the invention is to construct an improved equalization system which operates during the performance of a program to provide desired equalization of the broadcast audio program.

Another object of the invention is to eliminate program distortion in equalization performed during broadcast of program material.

One advantage of the invention is that sequential or random insertion of different frequency reference signals and the detection of such signals in a broadcast audio program can provide an accurate analysis of the audio response spectrum of the audio amplification system and its broadcast environment.

It is also an advantage of the invention that narrow band frequency signals of selected magnitude can be inserted into an electrical program signal being broadcast to provide a reliable standard against which detected audio frequency magnitudes in the broadcast signal can be compared to provide accurate measurement of the frequency response of the amplifying system and its broadcast environment.

Other features of the invention include the provision for broadcast of an audio reference signal masked by an adjacent tone of substantially larger magnitude; the provision of relatively short duration reference signals which due to shortness are relatively unnoticeable by human ear; and the provision of narrow band short duration low magnitude tones inserted into program signals being broadcast without distorting or producing any noticeable effect on the broadcast program. In one particular embodiment, successive narrow notch filters are applied to the program signal input to prevent program signal frequencies from interfering with sequential measurement of frequency response.

Other objects, advantages, and features of the invention will be apparent from the following description of the preferred embodiments and the accompanying drawings.

DESCRIPTION OF THE PREFERRED EMBODIMENT(S)

Figure 1:
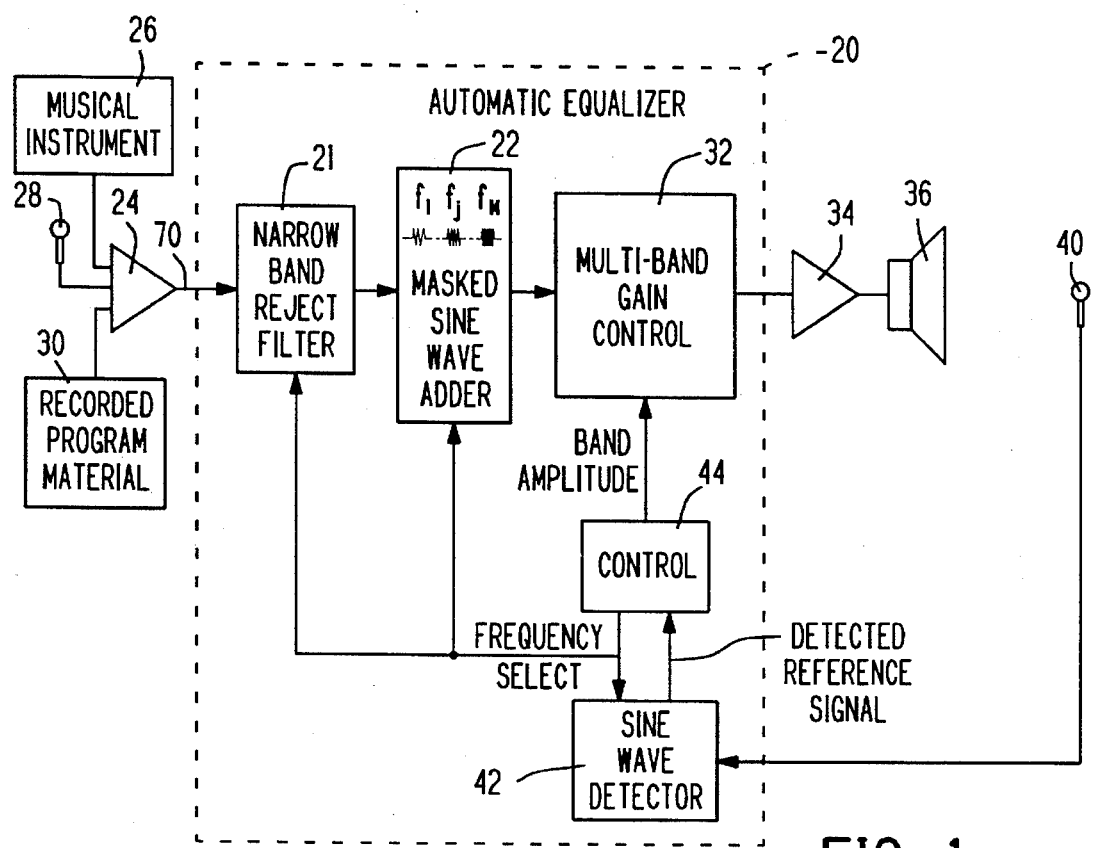
FIG. 1 is a diagram of an audio program amplification system including an automatic equalizer in accordance with the present invention.

As shown in FIG. 1, an automatic equalizer 20 in accordance with one embodiment of the invention includes a signal adder, such as a narrow band reject filter 21 and a masked sine wave adder 22, for sequentially or randomly adding narrow band reference frequency signals to an electrical program signal from an audio program signal source such as mixer/preamplifier 24. The mixer/preamplifier receives inputs from one or more program signal generators such as musical instrument 26, microphone 28, and/or recorded material player 30 which could be an audio tape player, record player, compact disk player, etc. The combined program and reference signal is passed through multiband gain control 32 to a power amplifier 34 which drives a speaker system 36 to broadcast the audio program. An audio pickup, such as reference microphone 40, is suitably positioned in the room, hall, or other location where the program is being broadcast to generate an electrical signal from the audio program being broadcast. A narrow band detector such as sine wave detector 42 detects the sequential reference signals in the electrical signal from the audio pickup 40. Control 44 controls the frequency selection and sequencing of the narrow band reject filter 21, the reference signal adder 22 and the narrow band detector 42. The control 44 also responds to the detected reference signals and controls the multi-band gain control unit 32 to adjust the attenuation and/or amplification of individual frequency bands in the combined program and reference signal so that the audio program received by the reference pickup 40 has a desired tonal quality.

Figure 2:
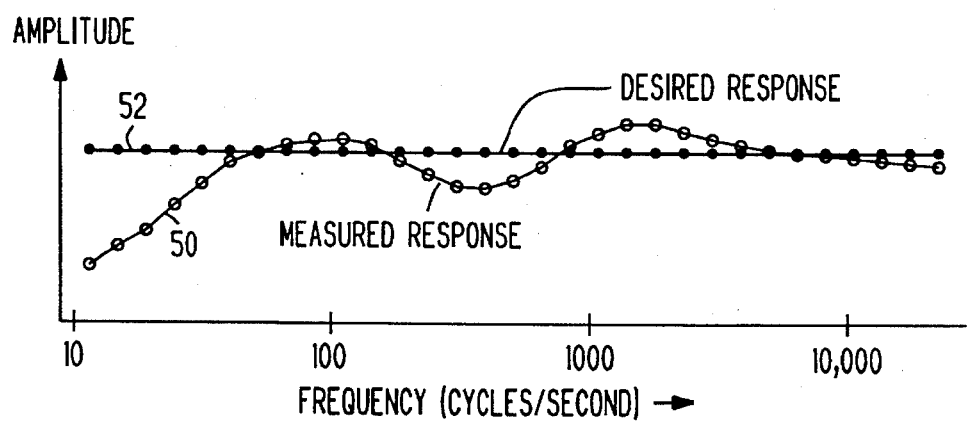
FIG. 2 is a graph illustrating a desired frequency response curve and a measured frequency response curve of the system of FIG. 1.

Speaker systems and rooms, concert halls or other places where programs are being broadcast often have a frequency response which distorts the tonal quality of the audio program being broadcast. For example as shown in FIG. 2, a measured frequency response in a room may correspond to curve 50 and the desired frequency response for distortion free listening may correspond to curve 52. The control 44 by adjusting individual frequency bands in the unit 32 increases the gain of selected frequency bands and decreases the gain of other frequency bands until the measured response as detected by detector 42 closely matches the desired response curve 52. Desired response curve 52 is shown uniform for all frequencies in the audio range; however, the desired response curve can have increased or decreased bass (low frequency), can have increased or decreased treble (high frequency), or can have any other uniform or non-uniform type of response desired by the performer(s) or listener(s).

If a test or reference signal is at frequency $\omega_i$, the magnitude of the detected signal for that frequency is the measured transfer function or frequency response $|H(\omega)|$. Testing for each of the succeeding frequencies $\omega_O \ldots \omega_M$ results in measured frequency responses $H(\omega_O) \ldots H(\omega_M)$ which approximate the transfer function $H(s)$. The gain or transfer function of individual frequency bands in the multiband gain control 32 are then automatically adjusted by frequency band correction functions $H_c(\omega_O) \ldots H_c(\omega_M)$ to approximate the desired frequency response $H_d(s)$.

The multiband gain control unit 32 is any device or electronic circuit which can be automatically controlled to vary the gain (attenuation and/or amplification) of selected audio frequency bands in the program signal being broadcast. The unit 32 can be digital, such as a digital filter, or can be analog. The number of frequency bands, the width and overlap of the bands, and the roll-off rate at the edges of the bands are selected based upon the desired resolution in frequency control and the desired control in the response curve.

In one embodiment, the unit 32 is an IIR phase compensated digital filter formed by a conventional algorithm in a microprocessor such as a DSP to form a thirty-one band filter with band center frequencies spaced one-third octave. The bands are globally programmable to have a width from one-half to one octave so that the sound engineer can choose the best width for for filter ripple control. Filter depth of the individual bands is controllable between +15 dB boost and −15 dB attenuation. High and low pass shelving filters are provided to control roll-off at the low and high frequency ends of the desired spectrum. The −3 dB points are selectable in one-sixth octave steps starting on the ISO specified center frequencies. The roll-off characteristic is controllable individually from −3 dB per octave through −24 dB per octave.

The narrow band reject filter 21 can be analog or digital. The function of the filter 21 is to substantially eliminate any program signal component having a frequency at the reference signal frequency being broadcast. The filter 21 has a width generally equal to or less than 1/12 of an octave, preferably equal to or less than 1/25 of an octave, and especially preferably equal to or less than 1/50 of an octave. As an alternative to the narrow band reject filter, the incoming program signal can be monitored for the frequency content at each reference or test frequency and the reference signal added only when the monitored program frequency component is substantially zero or insignificant. In a still further alternative, the incoming program signal can be monitored for a low magnitude component at the reference signal frequency and the monitored component can be supplemented or amplified, when necessary, to constitute the added reference signal.

The narrow band signal adder 22 can be digital or analog. Preferably the narrow band reference signals being added are masked so as to be non-obtrusive to the listeners of the audio program. Masking of the reference signal is performed by controlling one or more parameters such as the magnitude of the reference signal, the duration of the reference signal, and the insertion of the reference signal when there is an adjacent larger amplitude tone. A narrow band signal such as a single frequency sine wave has all of its energy concentrated at a single frequency whereas audio programs such as music, in general, are broad band. Therefore the amplitude of the sine wave with respect to the amplitude of the average music or program material amplitude can be quite small and indiscernible by human ear, yet still detectable and accurately measurable by electronic filtering. Such a reference signal which has a magnitude at least 10 dB, and preferably at least 20 dB, less than the magnitude of one or more other frequency components is not readily discernable by the listener. Reference signals of durations less than 20 cycles, and preferably less than 10 cycles, are also not readily discernable. Reference signals of a duration equal to or greater than about 2 cycles can be readily detected by the narrow band detector 42. Additionally, the masking of a reference tone can sometimes be enhanced when the reference tone is within a certain frequency proximity of a larger amplitude tone in the audio program. In some cases this enhanced masking effect occurs at about one-twelfth of an octave (one adjacent note on the music scale) and preferably within one-twenty-fourth of an octave; under some circumstances proximity requirements can be relaxed to be as far away as an octave or more, or proximity requirements can be eliminated at certain frequencies. Proximate notes larger by at least 10 dB and preferably larger by at least 20 dB exhibit the masking effect. Again the narrow band detector 42 can readily filter the reference signal from such adjacent program tones. Thus by waiting until a larger program note is proximate the frequency of the reference signal being added before adding the reference signal, the masking of an inserted narrow band reference signal is ensured.

The different frequencies of reference signals, under the control of unit 44, are added sequentially as a sequential set of frequencies, a random set of frequencies or as a most convenient set of frequencies. When the reference signals are added as a set of sequential frequencies, the program input is monitored until the required parameters are satisfied for each reference frequency in turn. In a random testing arrangement, reference frequencies of a set of reference signals which do not satisfy the required parameters in the incoming program signal are passed over with reference frequencies meeting the required parameters being tested first. The passed over frequencies are tested later when the required program parameters are met. In the "most convenient" arrangement, the selection of the reference signal to be added is selected by analyzing the incoming program signals to determine the best untested reference frequency candidate meeting the required parameters; for example, the reference signals proximate the largest frequency component in the audio program would be added first with the reference signals proximate the next largest frequency component being added next. If after an extended delay one or more generally isolated frequencies still do not meet testing requirements, such frequencies may be dropped from the set of test frequencies for the current frequency equalization procedure; no frequency response compensation or adjustment is necessary for frequencies not present in the program material being broadcast.

In one embodiment, the narrow band reject filter 21, the narrow band reference signal adder 22, the multi-band gain control 32, the control 44 and the narrow band detector 42 are all digital and are performed by conventional algorithms in one or more microprocessors such as DSPs. The incoming program signal 70 is digitized, passed through the DSP, and reconverted back into an analog signal for driving the power amplifier 34. Within the DSP, a series of the incoming digital program signals over a predetermined time segment are collected in a buffer. A Fourier transform such as a fast Fourier transform (FFT) is performed on the buffered time segment. The frequency spectrum generated by the Fourier transform is analyzed to determine suitability for adding a reference signal. When the incoming program signal is suitable for adding a reference signal, the narrow band reject filter is applied and then the reference signal is added to the digital signals which are subsequently operated on by a digital filter algorithm forming the multi-band control 32 in the DSP. Prior to adding each reference signal to the program signal, the incoming program signals are preferably notch filtered at the narrow frequency band of the reference signal to eliminate any effects of program frequencies or harmonics or acoustic feedback on the amplitude of the reference signal.

The reference signal has a known amplitude, duration and turn-on time $t_o$. Further there is a nominal time delay $t_d$ as sound travels from the speaker 36 to the reference pickup 40. The return signal from pickup 40 is digitized. At time $t_o+t_d$ a unity gain bandpass filter centered at the reference frequency detects the reference signal from the pickup 40. The magnitude of the picked up reference signal can be determined from the peak amplitude of the detected signal or by performing a single frequency wavelet transform. The reference signal magnitude is stored in a response table.

Monitoring the incoming program signal 70 and adding short duration reference signals of different frequencies in combination with a narrow band filter continues until the response table is complete, or sufficiently complete to accurately determine the frequency response curve of the speaker system and room in which broadcasting is being performed. Preferably there are a plurality of reference frequencies, such as three to five reference frequencies, within each frequency band of the multiband gain control 32. This enables discarding isolated untested reference signal values as well as reference signal values which are outside of a predetermined range and/or greatly differ from adjacent reference frequency values. Such out of range frequencies can be resonant (howl) frequencies which are being suppressed and do not reflect the true transfer function of the speaker system and audio environment. The response table, such as the measured response curve 50 in FIG. 2, is compared to the desired response. Based upon this comparison, individual frequency bands in the multiband gain control can be boosted or attenuated so as to render the measured response curve close to the desired response.

Additionally, the incoming program signal may be monitored for magnitude of a broadcast reference signal within an appropriate time window and/or compared to the frequency component magnitude before and/or after broadcast of the reference signal. Where the amplification system includes program material input from microphones, acoustic feedback of the broadcast reference signal can effect the overall transfer response. Monitoring the incoming program signal for acoustic feedback of the reference signal in the program signal enables the automatic equalizer to make an appropriate adjustment when necessary.

Figure 3:
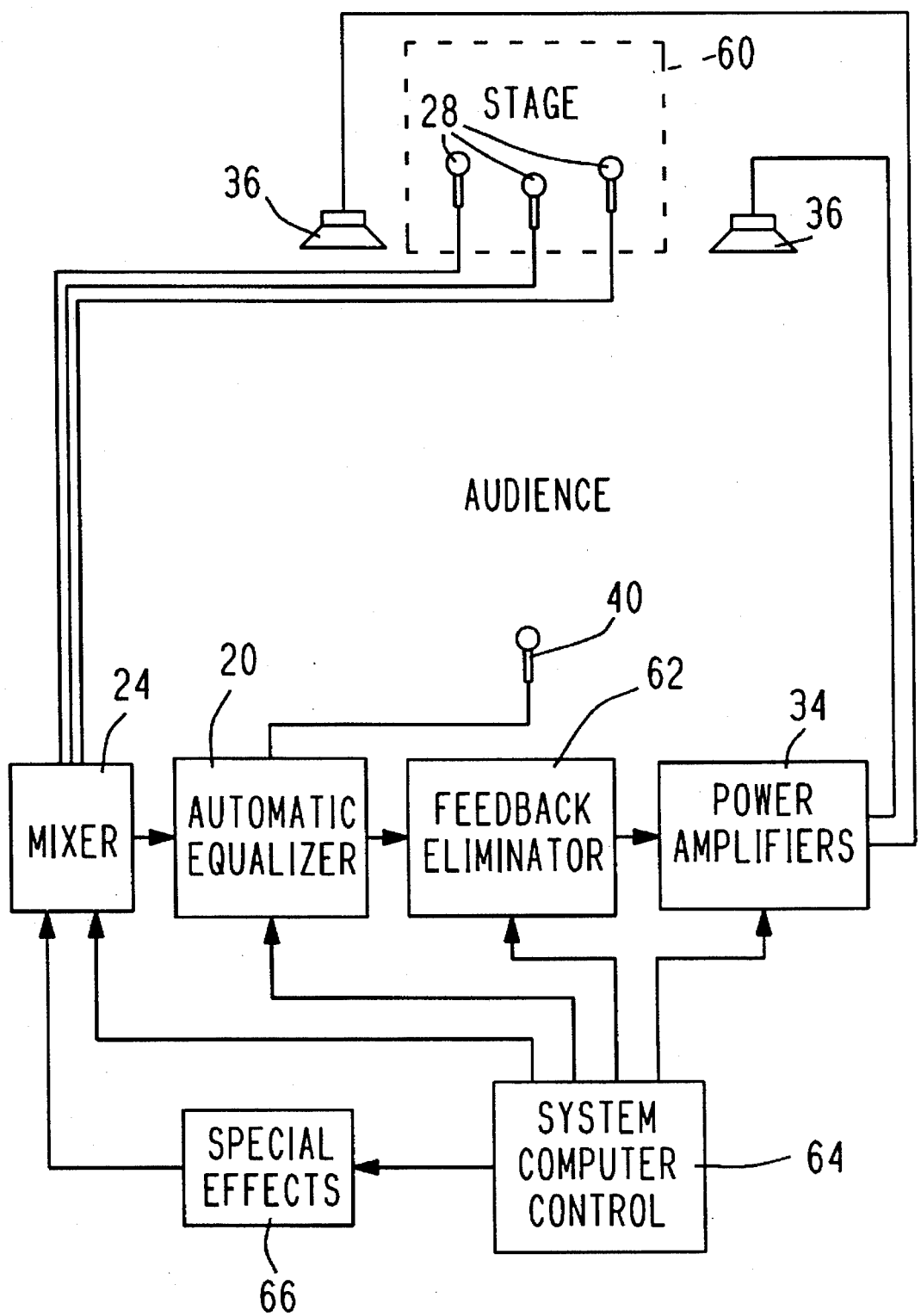
FIG. 3 is a diagram of another variation of the audio program amplification system including an automatic equalizer in accordance with the present invention.

Referring now to FIG. 3, there is shown an audio amplification system for a live performance auditorium wherein program audio from microphones 28 located on a stage 60 is suitably amplified and broadcast to an audience. The speakers 36 broadcasting the program to the audience are located on opposite sides and/or on the front of the stage 60.

An audio control center can be located anywhere in the auditorium such as to the rear of the audience, and can include the mixer 24, the automatic equalizer 20, a feedback eliminator 62, the power amplifiers 34, a system control 64, and a special effects generator 66. The reference signal pickup 40 is located at the control center, or at a location near or in the audience, to enable accurate pickup of the audio program being received by the audience.

The feedback eliminator 62 is a unit, circuit, or algorithm which eliminates unwanted acoustic feedback, sometimes called howl. An example of a suitable feedback eliminator is disclosed in U.S. Pat. No. 5,245,665. The feedback eliminator 62 monitors the program signal from the mixer 24, identifies any frequencies which become loud because of acoustic feedback, and attenuates identified howl frequencies to eliminate the acoustic feedback. When the automatic equalizer is digital, both equalizer 20 and feedback eliminator 62 can be formed by algorithm(s) in the same microprocessor or DSP.

The system control 64 is a conventional audio system control such as a computer control or switching system by which a program director can control the selection and the amplification of the program material being broadcast to the audience. While the stage microphones 28 and the pickup 40 are illustrated as being connected by cables to the amplification system, one or more of the microphones and/or reference pickup can be cable-free radio or infrared transmitting devices. The special effects generator 66 likewise is a conventional sound signal generator or processor and/or a playback device or arrangement such as one or more audio tape players, compact disk players, record players, etc.

Figure 5:
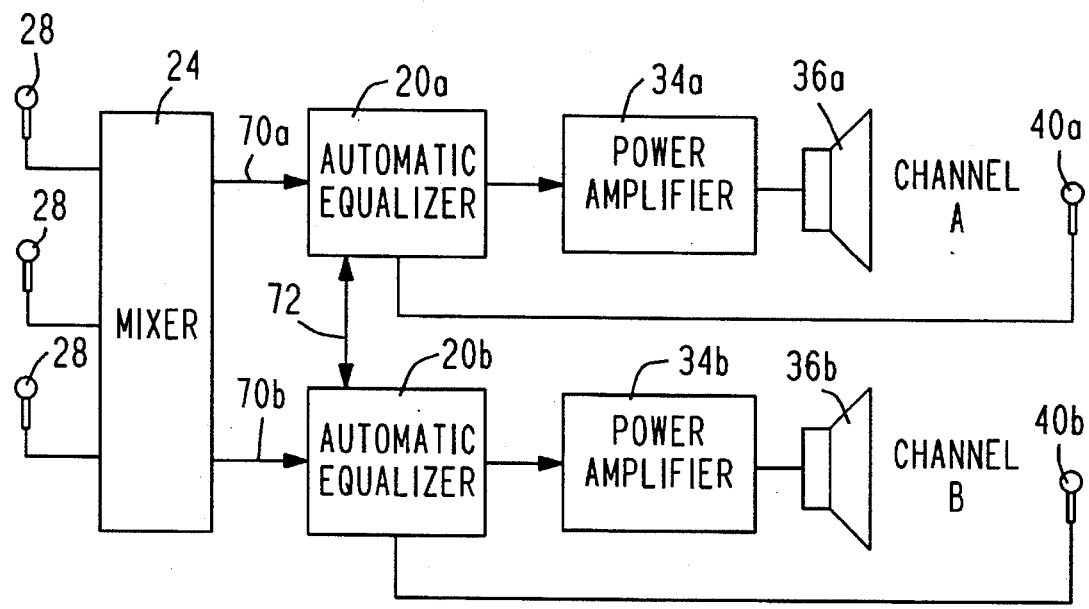
FIG. 5 is a diagram of a further variation of the audio program amplification system including two automatic equalizers in accordance with the present invention.

A stereo variation of the live performance amplification system is shown in FIG. 5. The mixer 24 produces respective left and right program signals 70a and 70b which are equalized by respective automatic equalizers 20a and 20b. The equalized program signals are then amplified by power amplifiers 34a and 34b and broadcast on left and right speaker systems 36a and 36b to the audience. Separate reference pickups 40a and 40b are suitably positioned on the left and right of the auditorium to test the frequency response of the corresponding channel. A communication and control link 72 connects the automatic equalizers 20a and 20b for arbitrating and/or synchronizing the testing frequency generation and response analysis, either so that audio reference signals are generated either simultaneously or non-simultaneously in both channels. Simultaneous deep narrow notch filtering of the program signal to eliminate program frequencies in both channels A and B during adding of a narrow band reference frequency signal is also controlled through the link 72.

The stereo variation illustrates two channels with equalization, but any number of separate channels can be broadcast with equalization in each channel. Communication links between the multiple equalization units provide for the arbitration and/or synchronization of the testing frequency generation and response analysis.

Figure 4:
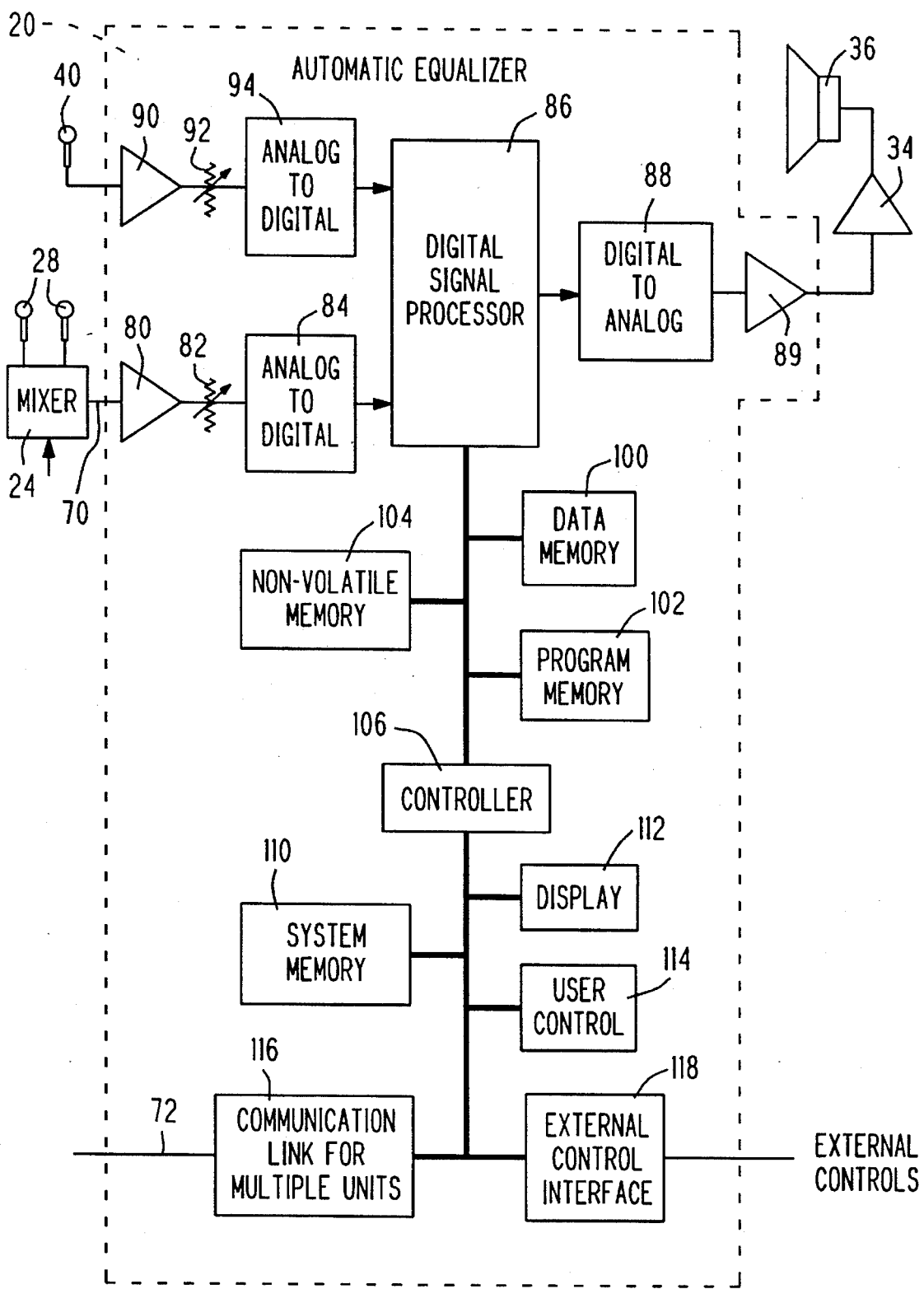
FIG. 4 is a detailed block diagram of one embodiment of an automatic equalizer in accordance with the invention.

One variation or embodiment of the automatic equalizer is illustrated in FIG. 4 wherein the program output 70 of mixer 24 from microphones 28 is an analog signal. This analog signal passes through buffer amplifier 80 to controlled output 82 by which the analog signal level can be adjusted to a suitable level and gain for input to analog to digital converter 84. The digitizer 84 is preferably a delta-sigma type or other conventional digitizer producing accurate digital signals of the program input signal for application to one input of a microprocessor such as a digital signal processor (DSP) 86. The digitizing is performed at a sufficient rate, for example 48 kilo-samples per second (KSPS), to provide suitable fidelity for the audio spectrum, for example 20 Hz to 20 KHz. After processing the stream of digital program signals in the DSP 86 to adjust the gain of different frequency bands in the program signals to compensate for distortion of audio program by the speaker and auditorium, the digital program signal stream is passed to a digital to analog convertor 88 which converts the adjusted program signals into an analog signal. The analog output of the convertor 88 is amplified by amplifier 89 to bring the signal level to an appropriate level for the power amplifier 34 driving speaker system 36.

Similarly the reference pickup 40 produces an analog signal which passes through amplifier 90 to controlled output 92 to analog to digital convertor 94. Digitizing of the reference signal is performed at a suitable rate, for example 48 KSPS. The digitized signals from the digitizer 94 are applied to a second input to the DSP 86. The reference pickup 40 in FIG. 4 is an analog microphone such as a dynamic microphone or a condenser microphone. The preamplifier 90 raises the analog signal level to a useable level such as about +6 dBv. It is not necessary for the reference microphone 40 to have a flat frequency response, since the DSP 86 can adjust detected frequency magnitudes to compensate for a known distortion or a calibrated frequency response of the reference microphone 40.

The DSP 86 is a part of a computer system including data memory 100 such as SRAM or DRAM, program memory 102 such as PROM, RAM and/or other suitable media, non-volatile memory 104 such as NV RAM, EEPROM, or other suitable device, and a system controller 106 which facilitates overall control, display, and system interface functions as may be required to accomplish the task. The system controller 106 includes system program and data memory 110 such as SRAM, DRAM, disk, etc., a user display 112 such as a CRT, LCD or other display, a user control interface 114 such as a keyboard, mouse, switch panel, and/or other suitable user control device, an inter unit communications controller 116 for multiple unit synchronization through link 72, and network interface 118 such as RS-232, RS-422, RS-485, fiber optic, ISDN, LAN, or any other serial or parallel interface. The system controller 106 and its components can be a separately housed processor system such as a personal computer (PC). The illustrated internal system controller adds convenience and flexibility. The display 112 can show the frequency response or transfer function of the system in the frequency domain both as a continuous spectrum or on a band by band basis.

Figure 6:
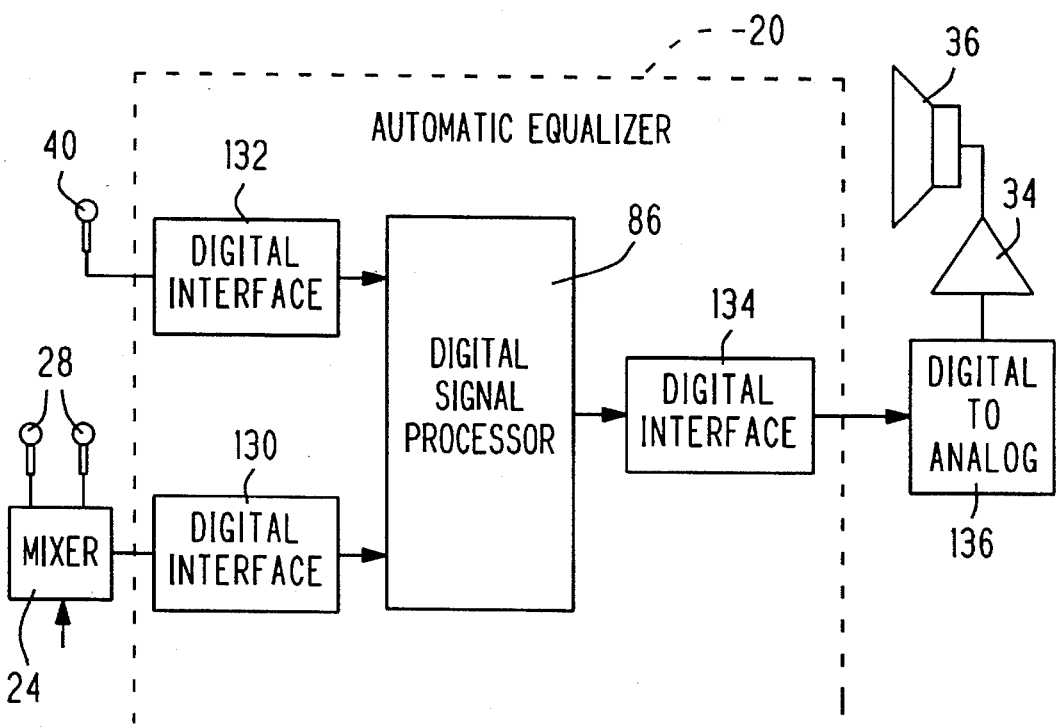
FIG. 6 is a detailed block diagram of a modification of the automatic equalizer of FIG. 4.

In a modification shown in FIG. 6, digital inputs from the mixer 24 and the reference microphone 40 are connected by respective digital interfaces 130 and 132 of the automatic equalizer 20 to the respective program and reference inputs of the DSP 86. In FIG. 6, the reference microphone 40 is a digital microphone. Also the program microphones 28 are digital, or the mixer 24 provides a digital output from the incoming microphone signals which may be analog. The equalized output of the DSP is applied through a digital interface 134 to a digital to analog converter 136 connected to the power amplifier 34. The interfaces 130 and 132 correctly interface the digital signals from the mixer and microphone outputs to the DSP 86 while the interface 134 interfaces the digital output of the DSP 86 to the digital to analog convertor 136. For example, conventional digital interfaces (AES/EBU, S/PDIF, or other) can be employed.

Figure 7:
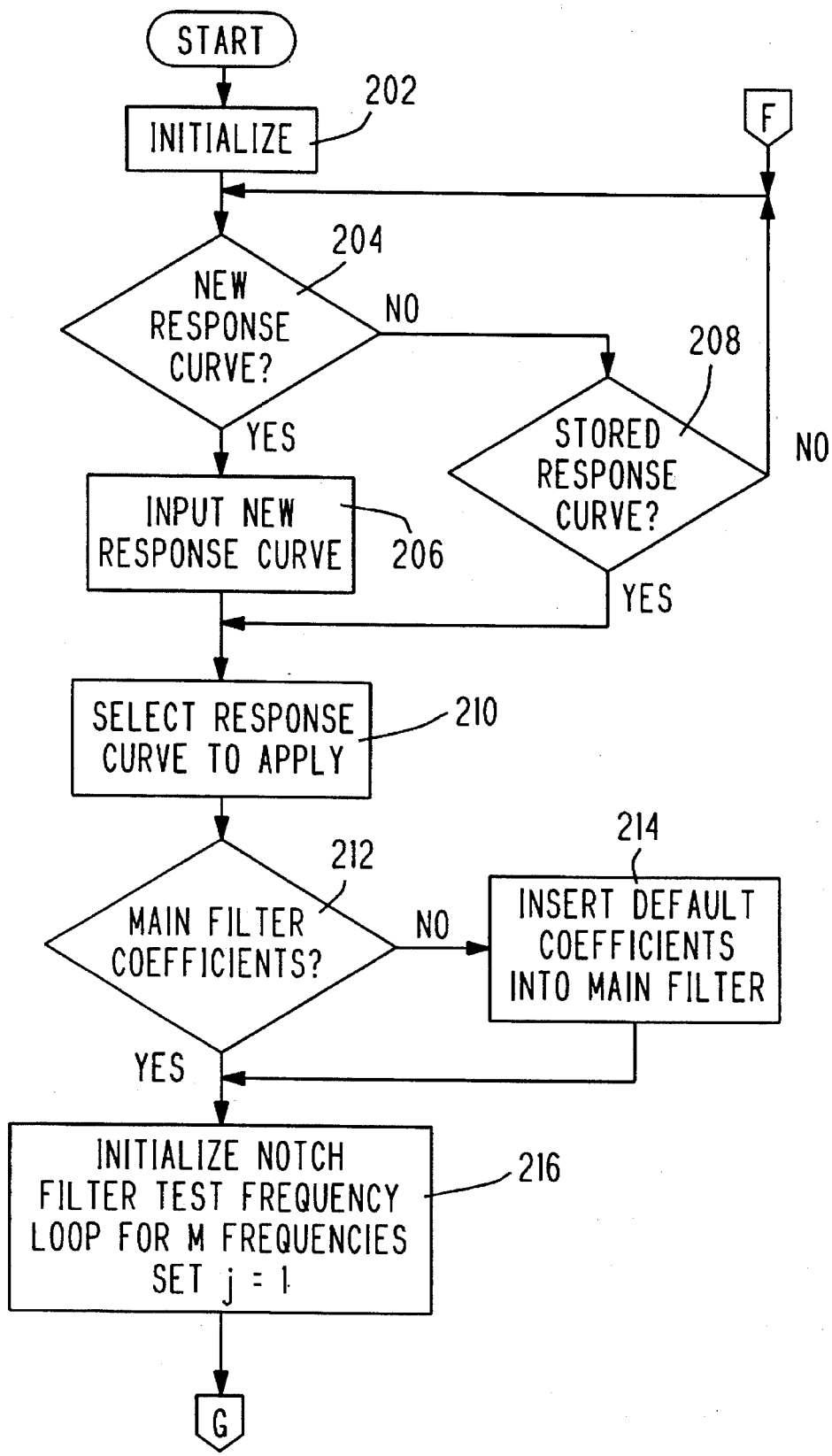
FIG. 7 is a program step flow chart of a first portion of a main program employed in a digital signal processor of FIGS. 4 and 6.
Figure 8:
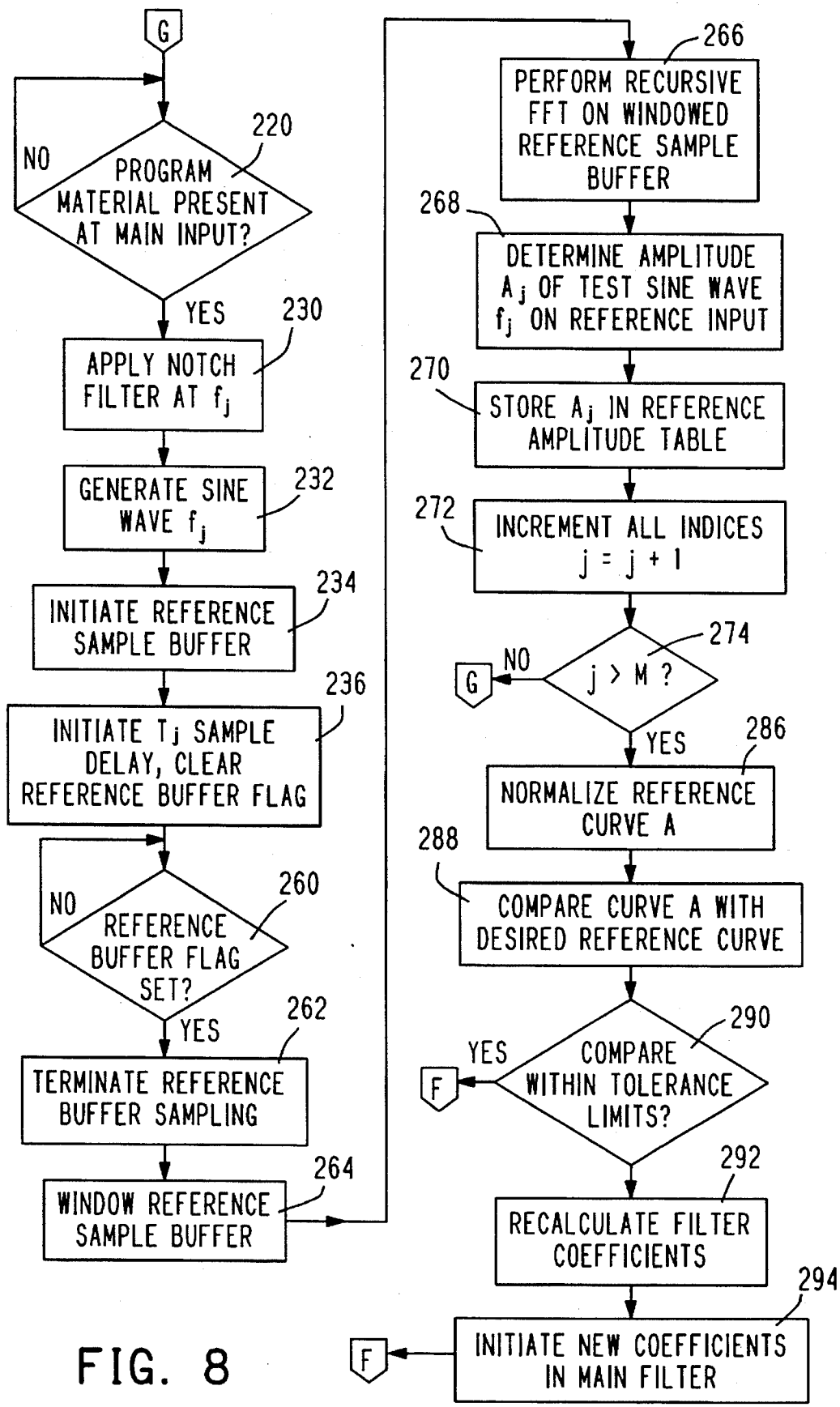
FIG. 8 is a program step flow chart of a second portion of the main program illustrated in part in FIG. 7.
Figure 9:
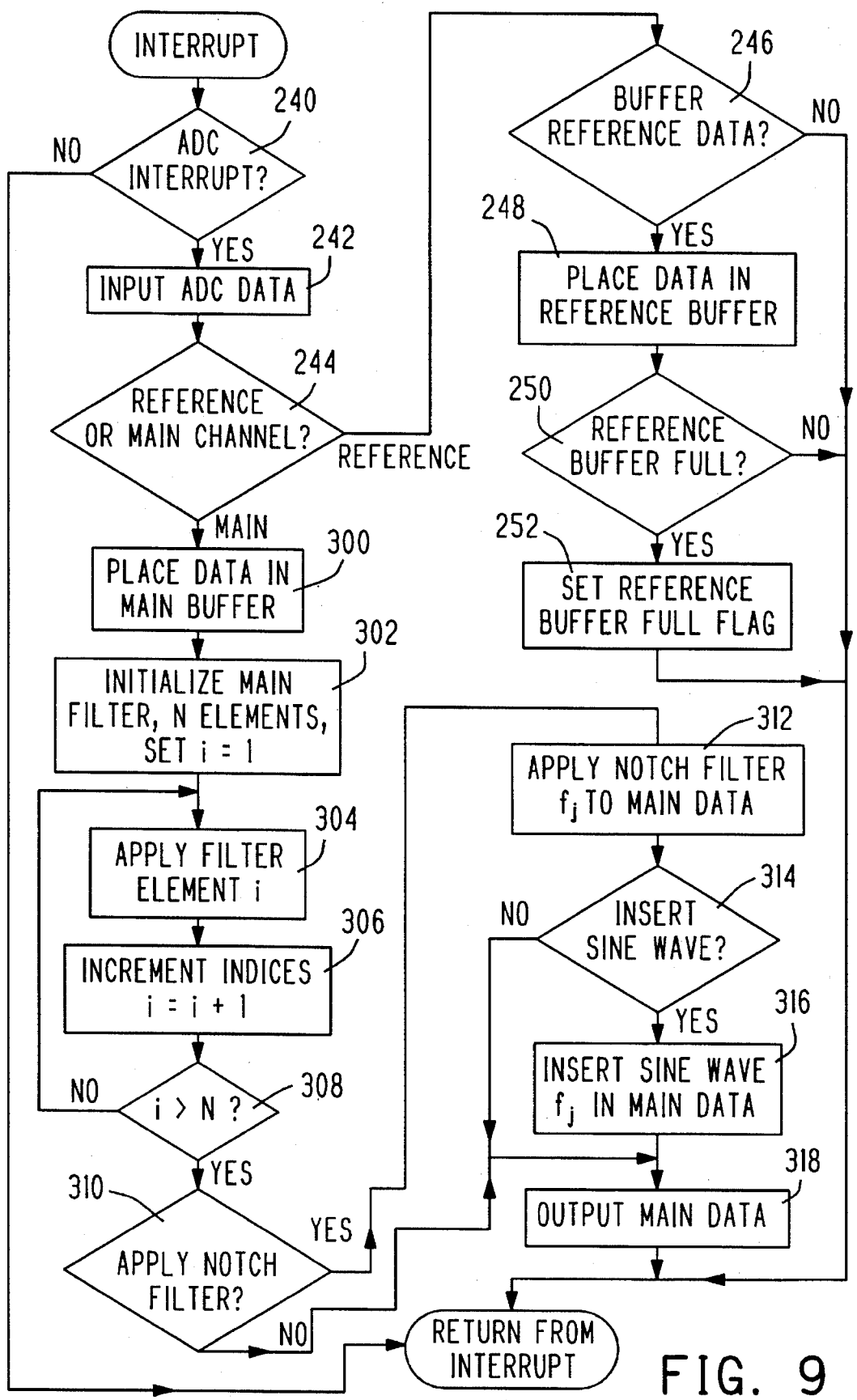
FIG. 9 is a program step flow chart of an interrupt procedure of a program employed in the digital signal processor of FIGS. 4 and 6.

An example of an operating program for the microprocessor or DSP 86 of FIGS. 4 and 6 is illustrated in FIGS. 7, 8 and 9. After power-on or startup, the DSP in step 202 initializes the system components to operate in the desired manner. In step 204 the operator by the display 112, FIG. 4, is queried about entering a new desired response curve. The desired frequency response of the speakers and hall or environment can be entered by the operator in step 206 and does not have to be flat as shown by curve 52 in FIG. 2, but can emphasize or de-emphasize certain ranges of frequencies, such as lower frequencies and/or higher frequencies. If the operator does not wish to enter a new response curve, the program in step 208 determines if a desired response curve exists. A previously entered response curve is stored in the non-volatile memory 104, FIG. 4, or the system can be set with a default flat response curve such as curve 52. If no previously entered curve exists, then the program returns to step 204 until the operator enters an new curve or accepts a default curve in step 206. In step 210 the operator selects one response curve from a plurality of previously stored curves or a default curve.

The software or program includes a conventional digital filter, such as a thirty-one band filter, which simulates the gain control functions of a manually controlled graphic equalizer. The filter centers are spaced at one-third octave throughout the audio spectrum and are controllable for gains from +15 dB boost to −15 dB cut or attenuation. Filter widths are controllable between 1.00 and 0.50 octave so that the ripples in the response curve can be controlled. Additionally, high and low pass shelving filters are provided to control roll-off at the low and high frequency ends of the audio spectrum. In these roll-off filters, the −3 dB points are selectable in ⅙th octave steps starting at the end specified center frequencies, and the roll-off characteristic is controllable from −3 dB per octave through −24 dB per octave. In step 212, it is determined if the equalizing or main filter is set up with coefficients, and if not, then branches through step 214 to initially set up the equalizing filter with default parameters of zero gain.

The program also includes a notch filter procedure to eliminate a selected narrow band of frequencies, such as ⅟50 of an octave. In step 216, a loop is initialized for sequentially determining the frequency response at a plurality of frequencies in the audio spectrum. Next in step 220, FIG. 8, it is determined if there is program material present on the main input 70 of the automatic equalizer 20. The program continues to cycle through step 220 until program material of sufficient magnitude is found. Generally the magnitude of the input program signal must be sufficient to produce about 60 dB sound output from the speaker system. This minimum sound level permits a low level narrow band or single frequency signal to be added to the input signal without being noticeable by the audience.

Figure 10:
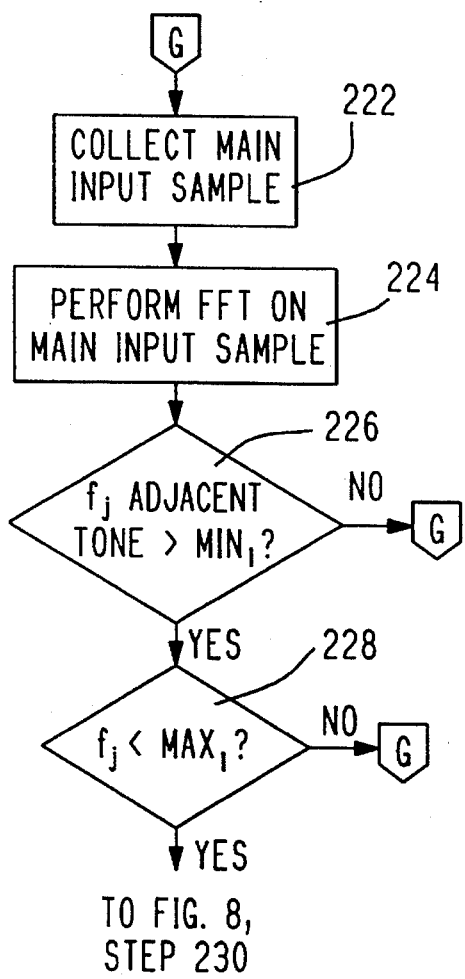
FIG. 10 is a program step flow chart of a modification of the program portion of FIG. 8.

In a variation of the main signal testing procedure of step 220 as shown in FIG. 10, a sample such as a time segment of 1024 digitized signal points is collected in step 222. Then is step 224 a fast Fourier transform (FFT) is performed on the input sample collected in step 222. Since the FFT is linear in frequency whereas the human tonal recognition is logarithmic in frequency, the FFT is performed over a plurality of ranges such as three ranges with different sample rates. The incoming signal is digitized at a rate of about 48,000 samples per second. For performing an FFT over a lower range from 20 to 200 Hz, a time segment of every fourth sample is collected in a 256 word buffer upon which the FFT with a resolution of about 1 Hz is performed. In an intermediate range from 200 to 2000 Hz, every second sample over an incoming time segment is collected and the FFT is performed with a resolution of 5 Hz. In an upper range from 2000 to 20,000 Hz, every sample over an incoming time segment is collected and the FFT is performed with a resolution of 50 Hz.

Next in step 226 it is determined if the present test frequency as adjacent a tone in the input signal which has a magnitude greater than a first minimum ($MIN_1$) such as equivalent to 50 dB sound from the speaker system. Generally the present test frequency must be within about ⅟12 octave, or preferably within about ⅟24 octave of a 50 dB or greater tone in the program signal. Finally in step 228, the content of the program signal at the test frequency must be less than a first maximum ($MAX_1$) such as 40 dB or less. By insuring that the test frequency is inserted in a program adjacent a tone of substantially larger magnitude and/or that the program content at the test frequency is small relative to the rest of the program magnitude, an added narrow band test signal of small magnitude will be unnoticed by the audience.

Once the program signal meets requirements needed to mask the test signal, the program in step 230 activates a narrow notch filter at the test frequency $f_j$. This narrow notch filter is preferably about ⅟50 octave or less, but may be wider, and has a depth sufficient to substantially remove any program content at the test frequency. Then in step 232, a narrow band test signal such as a sine wave $f_j$ is added to the program signal after the notch filter. This test signal has a relatively low magnitude, i.e., relative to the average amplitude of the program material, for example −40 dB lower, so that the test signal is generally indiscernible in the program being broadcast from the speaker system. Furthermore the test signal has a relatively short duration, e.g. from 2 to 20 cycles, to further mask its presence in the program being broadcast.

In steps 234 and 236, the program prepares to receive the reference signal from the reference input 40. A buffer for receiving a time segment of digital signal magnitudes is cleared in step 234. The reference signal from the input or pickup 40 is delayed, and in step 236, the program waits for this delay before initiating reference signal sampling and clearing the reference buffer flag. The delay can be from 0 to 300 milliseconds. This initiates the collection of a time segment of digital signals including the sine wave $f_j$ from the reference input of the DSP.

The collection of the incoming signals on the main and reference inputs to the DSP is performed by an interrupt procedure shown in FIG. 9. The interrupt is called by a hardware interrupt from the corresponding analog to digital convertor 84 or 94, FIG. 5, or from a digital interface 130 or 132, FIG. 6. In step 240, the program determines if the interrupt is from a digital signal input, such as an interrupt from one of the analog to digital convertors 84 or 94. If not, then the program proceeds to process the alternative interrupt (not shown) and/or to return from the interrupt if such processing is not to be performed while collecting a reference input sample. If there is a digital signal input to either the main or reference input of the DSP, then the digital signal is collected in step 242. Step 244 then causes the program to branch to step 246 when the input data is from the reference input. If a time segment of the reference data is being collected as determined in step 246, then the data is placed in the reference buffer in step 248; otherwise the program returns from the interrupt. Next in step 250, it is determined if the reference buffer has been filled; for example the buffer may collect 1024 data samples. If the buffered is now filled, the program in step 252 sets the reference buffer full flag. From step 250 when false or from step 252, the program returns from the interrupt.

Referring back to FIG. 8, the main program cycles through step 260 until the reference buffer flag is set in step 252. Then in step 262 the sampling of the reference input is terminated. Next in step 264 an appropriate window is taken in the samples collected in the buffer. The digital signals collected in the reference buffer may be collected over a time period exceeding the duration of the generated reference signal, and an appropriate window covering a portion of the collected reference signals can be set. Alternatively, the collected signals can be examined to determine the appropriate time frame or window of the reference signal in the collected samples.

In step 266 a recursive FFT is performed on the windowed reference samples in the reference buffered. From the FFT the amplitude $A_j$ of the test sine wave or narrow band reference signal can be determined in step 268. This amplitude $A_j$ is stored in the appropriate position in a reference curve table in step 270. Then in step 272, the index j is incremented. If the index j is less than the last index M in step 274, the program returns to point G and step 220 to begin a test procedure for the next test frequency.

Figure 11:
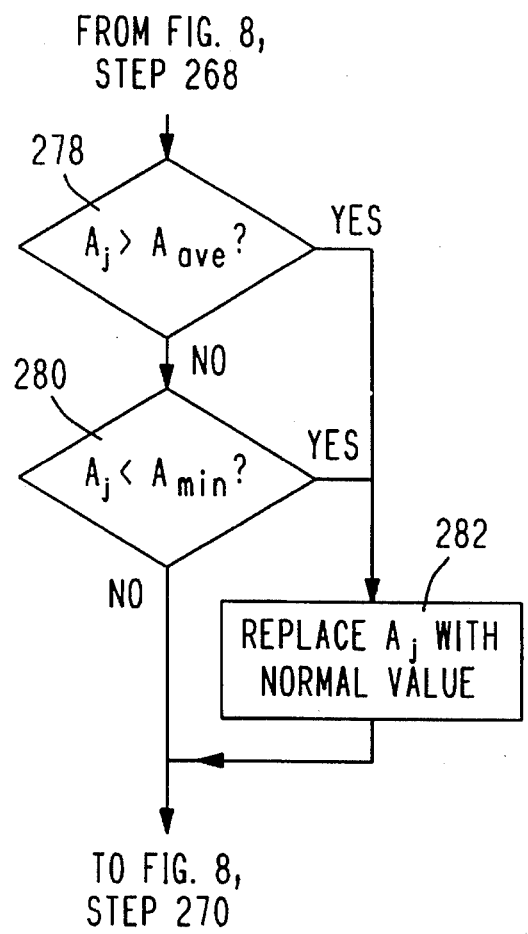
FIG. 11 is a program step flow chart of another modification of the program portion of FIG. 8.

Preferably the table of test frequencies collected in step 270 includes from three to five frequencies for each frequency band of the main filter. This enables the program to discard some test frequencies which are clearly not representative of the response transfer function, and/or to average the corresponding magnitudes. For example, several narrow band filters often attenuate the broadcast signal in the feedback eliminator 62, FIG. 3, to eliminate acoustic feedback or howl. When a test frequency falls on an attenuated acoustic feedback frequency, the magnitude for that frequency will be greatly reduced. As shown in FIG. 11, the program can include steps 278 and 280 which determine when a magnitude of a reference frequency is substantially larger and substantially smaller, respectively, and eliminates the out of bounds magnitude by replacing with a normal value in step 282 or otherwise ignore the out of bounds magnitude.

Referring back to FIG. 8, the program in step 286 normalizes the magnitudes collected in the reference curve table by steps 270 to produce a measured response curve such as the curve 50 of FIG. 2. In step 288, the normalized curve is then compared with the desired response curve such as curve 52. If the differences between portions of the measured response curve and the desired response curve are outside of predetermined tolerance limits in step 290, then the program in step 292 recalculates the main filter coefficients for the out of tolerance frequency bands to boost or attenuate the bands and cause the response to bring the affected bands into the tolerance range of the desired frequency bands. From step 290 if true or from step 294, the program returns to point F of FIG. 7 and waits for the operator to order another adjustment or enter another response curve. Alternatively, the program could cycle through step 216 instead of step 204 and continuously measure the response with automatic adjustment of the equalizer as needed.

When the incoming digitized signals are from the main input 70, the interrupt procedure of FIG. 9 branches from step 244 to step 300 where the data is placed in the buffer of the main filter. In step 302 the main filter index is set to 1. Next in steps 304 and 406, the program applies or performs filter element i and increments the index, respectively. Step 308 causes the program to cycle through steps 304 and 306 until the all N elements (such as thirty-one filter frequency band elements and two shelving elements) of the filter are performed. The program then in step 310 determines if a notch filter is presently required in the program digit stream.

If so the program in step 312 applies or performs the notch filter on the digital data. Then in step 314 the program determines if it is the proper time to insert a narrow band frequency signal into the main data, and if so, adds the appropriate sine wave digital data to the program digital data in step 316. Finally from step 310 if false, step 314 if false or from step 316, the last digitized value in the filter buffer is output in step 318 from the DSP 86 either to the digital to analog converter 88 in FIG. 5 or the digital interface 134 in FIG. 6. Thus the program signal is continuously passed through the automatic equalizers of FIGS. 5 and 6 and the gains of the plurality of frequency bands in the program signal are adjusted as needed to change the measured frequency response 52 to the desired response 50.

Since many variations, modifications and changes in detail can be made in the above described embodiments without departing from the scope and spirit of the invention as defined in the following claims, it is intended that the above description of the preferred embodiments and the accompanying drawings be interpreted as only illustrative and not in a limiting sense.

What is claimed is:

1. An automatic equalizer for an audio program amplification system having an audio program signal source for producing an electrical program signal, a power amplifier for amplifying the electrical program signal to produce an amplified program signal, and a speaker receiving the amplified program signal for broadcasting an amplified audio program; the equalizer comprising:

an adder for sequentially adding a plurality of narrow band acoustic reference signals of different frequencies to the electrical program signal;

an acoustic pickup for receiving the amplified audio program broadcast by the speaker and for converting the received amplified audio program into an electrical reference signal;

a detector for detecting the sequential plurality of narrow band acoustic reference signals in the electrical reference signal; and variable amplitude control means responsive to the detected sequential plurality of narrow band acoustic reference signals for adjusting amplitudes of frequency bands of the electrical program signal to correspond to a desired frequer response.

2. An automatic equalizer as claimed in claim 1 wherein the adder includes means for masking the narrow band acoustic reference signals in the electrical program signal.

3. An automatic equalizer as claimed in claim wherein the masking means includes means for sensing a predetermined magnitude of program signal, and the added adds the narrow band acoustic reference signals in resp the sensing of the predetermined magnitude of program signal.

4. An automatic equalizer as claimed in claim 3 wherein the adder adds the narrow band acoustic reference signals at magnitudes substantially less than the predetermined magnitude.

5. An automatic equalizer as claimed in claim 2 wherein the adder adds the narrow band acoustic reference signals for durations which are less than sound durations normallly required for perception by human ear.

6. An automatic equalizer as claimed in claim 5 wherein the durations of the added narrow band acoustic reference signals for different frequencies of the narrow band acoustic reference signals vary inversely with frequency.

7. An automatic equalizer as claimed in claim 1 including a variable narrow band reject filter operated in synchronism with the adder for substantially eliminating frequency components from the program signal at the respective frequencies of the narrow band acoustic reference signals prior to adding the narrow band acoustic reference signals to the program signal.

8. An automatic equalizer as claimed in claim 7 wherein the adder includes means for masking the narrow band acoustic reference signals in the electrical program signal.

9. An automatic equalizer as claimed in claim 1 wherein the adder, the detector, and the variable amplitude control means comprise microprocessor means and respective adder, detector and variable amplitude control algorithm procedures performed in the microprocessor means.

10. An automatic equalizer as claimed in claim 9 including a variable narrow band reject filter operated in synchronism with the adder for substantially eliminating frequency components from the program signal at the respective frequencies of the narrow band acoustic reference signals prior to adding the narrow band acoustic reference signals to the program signal.

* * * * *